US012208984B2

(12) United States Patent
Uchiho et al.

(10) Patent No.: US 12,208,984 B2
(45) Date of Patent: Jan. 28, 2025

(54) TAPE AFFIXING APPARATUS

(71) Applicant: DISCO CORPORATION, Tokyo (JP)

(72) Inventors: Takashi Uchiho, Tokyo (JP);
Yoshinobu Saito, Tokyo (JP);
Jonghyun Ryu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 205 days.

(21) Appl. No.: 17/931,693

(22) Filed: Sep. 13, 2022

(65) Prior Publication Data

US 2023/0093583 A1    Mar. 23, 2023

(30) Foreign Application Priority Data

Sep. 21, 2021    (JP) ................................ 2021-153175

(51) Int. Cl.
*B65H 37/04*      (2006.01)
*B65H 18/10*      (2006.01)
*B65H 35/00*      (2006.01)

(52) U.S. Cl.
CPC ............ *B65H 37/04* (2013.01); *B65H 18/103* (2013.01); *B65H 35/0033* (2013.01); *B65H 2404/1522* (2013.01); *B65H 2701/377* (2013.01)

(58) Field of Classification Search
None
See application file for complete search history.

(56) References Cited

U.S. PATENT DOCUMENTS

2011/0024020 A1*   2/2011   Kawashima ............ B29C 63/02
                                                         156/60
2022/0020614 A1*   1/2022   Masuda ............ H01L 21/67132

FOREIGN PATENT DOCUMENTS

| JP | 2010062375 A | | 3/2010 |
|----|--------------|---|--------|
| JP | 2018107309 A | * | 7/2018 |
| JP | 2022019392 A | | 1/2022 |

OTHER PUBLICATIONS

Machine English translation of JP2018107309, Accessed May 29, 2024 (Year: 2018).*

* cited by examiner

*Primary Examiner* — Jacob T Minskey
*Assistant Examiner* — Adrianna N Konves
(74) *Attorney, Agent, or Firm* — Greer, Burns & Crain, Ltd.

(57) ABSTRACT

A tape affixing apparatus includes a frame support table for supporting an annular frame, a lifting and lowering unit for lifting and lowering the frame support table, a tape affixing unit, and a controller. The tape affixing unit includes a tape uncoiler, a tape take-up reel, and a presser roller movable from one end to the other end of the annular frame supported on the frame support table while pressing a tape paid out from the tape uncoiler to affix the tape to the annular frame. The controller positions the presser roller in a pressing position, affixes the tape to one end of the annular frame while applying tension to the tape, moves the presser roller toward the other end of the annular frame, and keeps the tension on the tape constant by lifting the frame support table in synchronism with the presser roller as it is moved.

8 Claims, 6 Drawing Sheets

TAPE AFFIXING APPARATUS

BACKGROUND OF THE INVENTION

Field of the Invention

The present invention relates to a tape affixing apparatus for affixing a tape to an annular frame having an opening defined centrally therein for accommodating a wafer therein.

Description of the Related Art

Wafers having on their face sides a device region that includes a plurality of devices such as integrated circuits (ICs) or large scale integration (LSI) circuits formed in respective areas demarcated by a plurality of projected dicing lines and an outer circumferential excess region surrounding the device region are ground on their reverse sides to a desired thickness and then divided into individual device chips by a laser processing apparatus. The device chips will be used in electronic appliances such as mobile phones and personal computers.

The applicant of the present invention has proposed a technology that, for facilitating the delivery of a ground wafer, processes the wafer to leave a ring-shaped stiffener on the reverse side thereof on and along the outer circumferential excess region, thereafter affixes a dicing tape to the reverse side of the wafer, supports the wafer on an annular frame, and then removes the ring-shaped stiffener from the wafer (see, for example, Japanese Patent Laid-open No. 2010-62375).

However, the technology disclosed in Japanese Patent Laid-open No. 2010-62375 is problematic in that it is difficult to perform a process of affixing the dicing tape to the reverse side of the wafer with the ring-shaped stiffener disposed as a protruding ridge on the reverse side along the outer circumferential excess region, and it is also difficult to cut off and remove the ring-shaped stiffener from the wafer, with the result that the technology is poor in productivity.

In view of the above problems, the present applicant developed a processing apparatus for removing a ring-shaped protruding stiffener from a wafer where the ring-shaped protruding stiffener is disposed on a reverse side of the wafer along an outer circumferential excess region thereof, and filed a patent application on the technology on Jul. 17, 2020 (Japanese Patent Application No. 2020-123301).

SUMMARY OF THE INVENTION

However, it has been found that, when the ring-shaped stiffener is removed from the wafer that is affixed to a tape of a tape-affixed annular frame disclosed in Japanese Patent Application No. 2020-123301, the tape affixed to the annular frame and the wafer tends to develop wrinkles, causing trouble at the time of dividing the wafer into individual device chips.

It is therefore an object of the present invention to provide a tape affixing apparatus that is capable of preventing a tape of a tape-affixed annular frame from developing wrinkles when a ring-shaped stiffener is removed from a wafer that is affixed to the tape.

In accordance with an aspect of the present invention, there is provided a tape affixing apparatus for affixing a tape to an annular frame having an opening defined centrally therein for accommodating a wafer therein. The tape affixing apparatus includes a frame support table for supporting the annular frame thereon, a lifting and lowering unit for lifting and lowering the frame support table, a tape affixing unit disposed in facing relation to the frame support table, and a controller, in which the tape affixing unit includes a tape uncoiler for paying out the tape, a tape take-up reel for winding up the tape that has been used, and a presser roller disposed between the tape uncoiler and the tape take-up reel and movable from one end to the other end of the annular frame supported on the frame support table while pressing the tape paid out from the tape uncoiler to affix the tape to the annular frame, and the controller positions the presser roller in a pressing position, affixes the tape to the one end of the annular frame while applying tension to the tape, moves the presser roller toward the other end of the annular frame, and keeps the tension applied to the tape constant by lifting the frame support table in synchronism with the presser roller as it is moved.

Preferably, when the presser roller is positioned in the pressing position, the tape is slanted at an elevation angle upwardly from the presser roller toward the tape take-up reel, and the frame support table is lifted in synchronism with the presser roller as it is moved, so that the elevation angle is kept constant. Preferably, the tape affixing unit includes a cutter rotatable in contact with the annular frame for cutting the tape.

The tape affixing apparatus according to the present invention is able to prevent the tape from developing wrinkles when a ring-shaped stiffener is removed from the wafer affixed to a tape of a tape-affixed annular frame. Therefore, no trouble is caused at the time of dividing the wafer into individual device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A tape affixing apparatus according to a preferred embodiment of the present invention will be described hereinbelow with reference to accompanying drawings.
(Tape Affixing Apparatus 2)

Figure 1:
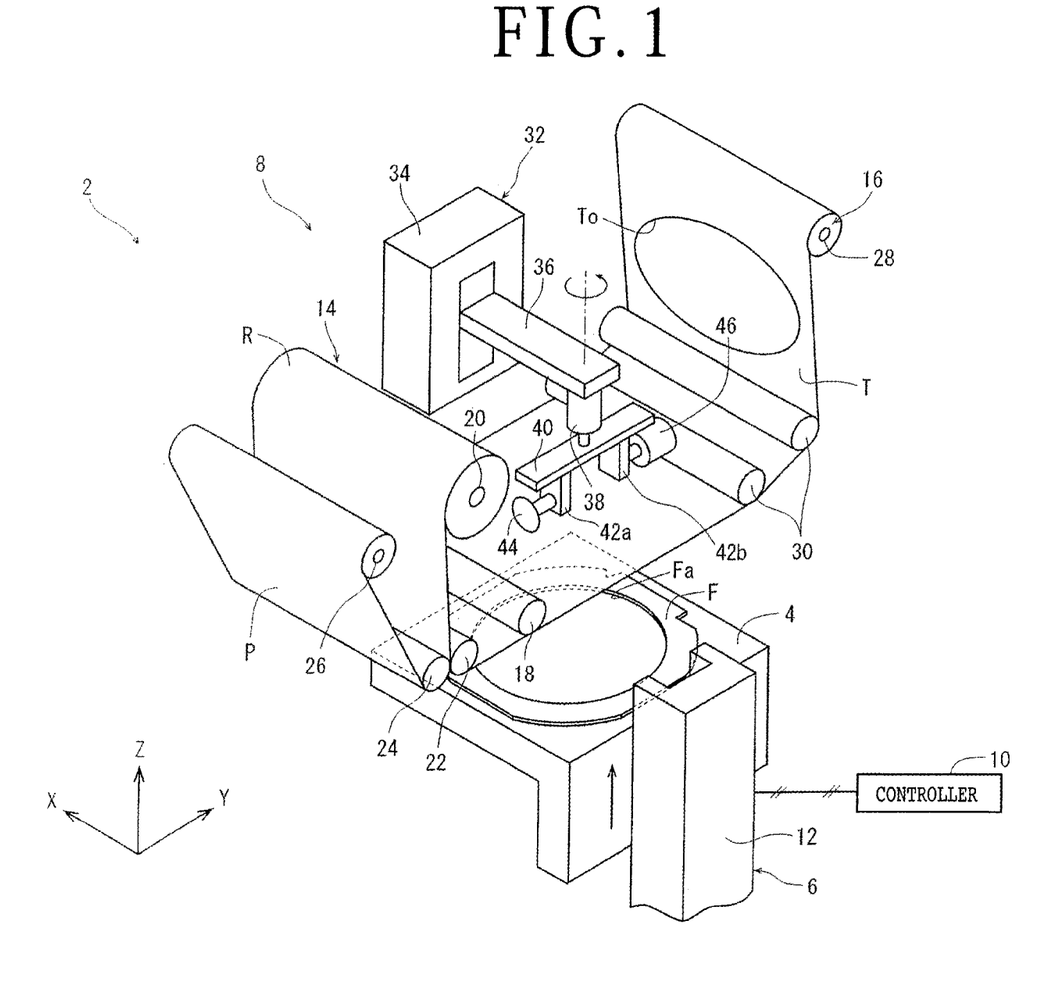
FIG. 1 is a perspective view of a tape affixing apparatus according to an embodiment of the present invention.

As illustrated in FIG. 1, a tape affixing apparatus, generally denoted by the reference sign 2, includes at least a frame support table 4 for supporting an annular frame F thereon, a lifting and lowering unit 6 for lifting and lowering the frame support table 4, a tape affixing unit 8 disposed in facing relation to the frame support table 4, and a controller 10. These components of the tape affixing apparatus 2 will be described in detail below.
(Lifting and Lowering Unit 6)

The lifting and lowering unit 6 includes a vertically extending guide member 12 that supports the frame support table 4 such that the frame support table 4 can be lifted and lowered and a lifting and lowering mechanism, not illustrated, mounted on the guide member 12. The lifting and lowering mechanism may be of a structure having a vertically extending ball screw that is operatively coupled to the frame support table 4 and that extends along the guide member 12 and an electric motor for rotating the ball screw about its central axis. When the lifting and lowering mechanism is actuated, it rotates the ball screw about its central axis, causing the frame support table 4 to be selectively lifted and lowered along the guide member 12.
(Tape Affixing Unit 8)

The tape affixing unit 8 includes a tape uncoiler 14 for paying out a tape T, a tape take-up reel 16 for winding up the tape T that has been used, and a presser roller 18 disposed between the tape uncoiler 14 and the tape take-up reel 16 and movable from one end to the other end of the annular frame F supported on the frame support table 4 while pressing the tape T paid out from the tape uncoiler 14 to affix the tape T to the annular frame F.
(Tape Uncoiler 14 of the Tape Affixing Unit 8)

The tape uncoiler 14 includes a support roller 20 for supporting thereon a tape roll R of the tape T rolled into a tubular form before it is used, a delivery roller 22 disposed below the support roller 20, an electric motor, not illustrated, for rotating the delivery roller 22 about its central axis, and a driven roller 24 rotatably held against the delivery roller 22 with the tape T paid out from the tape roll R interposed therebetween, the driven roller 24 being rotatable as the delivery roller 22 rotates. The tape T of the tape roll R is combined with a peel-off sheet P affixed to one surface of the tape T. Therefore, the tape roll R is made up of the tape T and the peel-off sheet P that are affixed to each other and coiled together.

The tape uncoiler 14 operates as follows. When the electric motor is energized, it rotates the delivery roller 22, rotating the driven roller 24 in unison therewith, thereby pulling the tape T from the tape roll R. The tape T thus supplied from the tape roll R is sandwiched between the delivery roller 22 and the driven roller 24. When the tape T has passed between the delivery roller 22 and the driven roller 24, the peel-off sheet P is peeled off from the tape T and trained around the driven roller 24 to be wound up by a peel-off sheet roller 26 for retrieval.

(Tape Take-Up Reel 16 of the Tape Affixing Unit 8)

The tape take-up reel 16 includes a take-up roller 28 for winding up the tape T that has been used, an electric motor, not illustrated, for rotating the take-up roller 28 about its central axis, and a pair of parallel guide rollers 30 disposed between the delivery roller 22 and the take-up roller 28. One of the guide rollers 30 that is closer to the frame support table 4 is lower than the other of the guide rollers 30.

The tape take-up reel 16 operates as follows: When the electric motor is energized, it rotates the tape take-up roller 28 about its central axis, pulling the used tape T where a circular opening To (see FIG. 1) has been left by a circular tape blanked out of the tape T from the tape roll R. When pulled, the used tape T is guided by the guide rollers 30 and wound up by the take-up roller 28.
(Presser Roller 18 of the Tape Affixing Unit 8)

Figure 2:
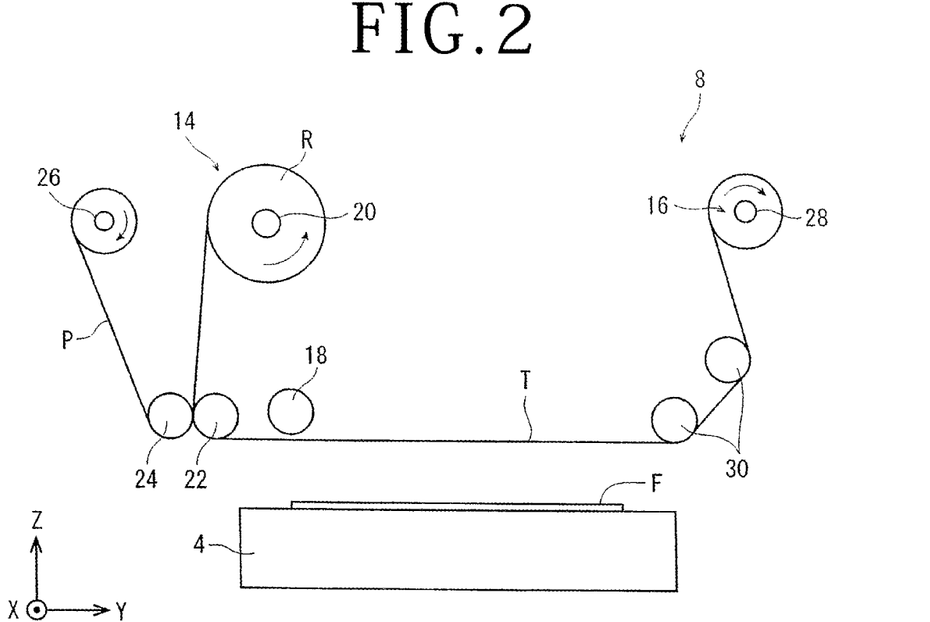
FIG. 2 is a schematic side elevational view of the tape affixing apparatus illustrated in FIG. 1.
Figure 3:
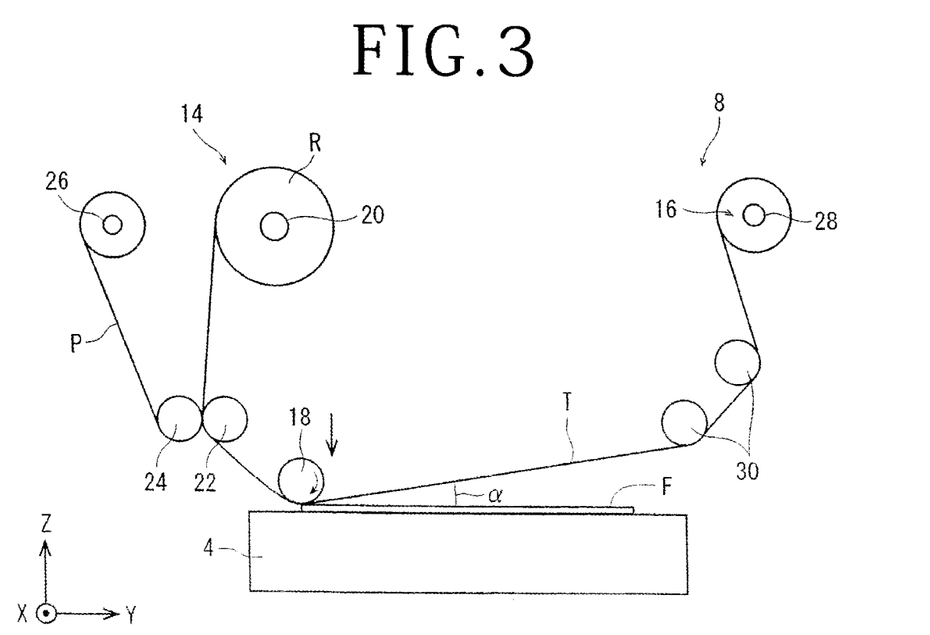
FIG. 3 is a schematic side elevational view illustrating the manner in which a presser roller is positioned in a pressing position and a tape is affixed to an end of an annular frame.

As illustrated in FIGS. 2 and 3, the presser roller 18 that can be lifted and lowered by presser roller positioning means, not illustrated, is positioned selectively in an upper standby position illustrated in FIG. 2 and a lower pressing position illustrated in FIG. 3. While being positioned in the lower pressing position, the presser roller 18 can be moved in a Y-axis direction by presser roller moving means, not illustrated.

The Y-axis direction is indicated by the arrow Y in FIGS. 1 through 5. An X-axis direction is indicated by the arrow X in FIGS. 1 through 5 and is perpendicular to the Y-axis direction. A Z-axis direction is indicated by the arrow Z in FIGS. 1 through 5 and represents a vertical direction perpendicular to the X-axis direction and the Y-axis direction. An XY plane that is defined by the X-axis direction and the Y-axis direction lies substantially horizontal.
(Cutting Mechanism 32 of the Tape Affixing Unit 8)

According to the present embodiment, as illustrated in FIG. 1, the tape affixing unit 8 includes a cutting mechanism 32 including a circular cutter 44 rotatable in abutment against the annular frame F to blank a circular tape out of the tape T. The cutting mechanism 32 includes a Z-axis guide member 34 extending in the Z-axis direction, a Z-axis movable member 36 movably supported on the Z-axis guide member 34 for movement in the Z-axis direction, and Z-axis feed means, not illustrated, for moving the Z-axis movable member 36 in the Z-axis direction. The Z-axis feed means may have a ball screw operatively coupled to the Z-axis movable member 36 and extending in the Z-axis direction and an electric motor for rotating the ball screw about its central axis.

The cutting mechanism 32 also includes an electric motor 38 fixed to a lower surface of the distal end of the Z-axis movable member 36 and an arm 40 rotatably coupled to the electric motor 38 for rotation about an axis extending in the Z-axis direction. The arm 40 has a lower surface from which first and second support plates 42a and 42b hang at respective positions spaced from each other. The circular cutter 44 is rotatably supported on the first support plate 42a for rotation about an axis perpendicular to the Z-axis direction. When the circular cutter 44 is rotated about the axis, it follows a circular path along the outer circumferential edge of an annular frame F placed on the frame support table 4. A presser roller 46 is rotatably supported on the second support plate 42b for rotation about an axis perpendicular to the Z-axis direction.
(Controller 10)

The controller 10 includes a computer having a central processing unit (CPU) for performing arithmetic processing operations according to control programs, a read only memory (ROM) for storing the control programs, etc., and a read/write random access memory (RAM) for storing results of the arithmetic processing operations performed by the CPU. The controller 10 controls operation of the lifting and lowering unit 6 and the tape affixing unit 8.

(Annular Frame F)

The annular frame F to which the tape T is affixed by the tape affixing apparatus 2 is of an annular shape having a circular opening Fa defined centrally therein for accommodating a wafer therein.

(Tape T)

The tape T may include an adhesive tape having a sticky layer, i.e., a glue layer, on a surface thereof or a thermocompression bonding sheet having no sticky layer. The thermocompression bonding sheet includes a sheet of thermoplastic synthetic resin, e.g., polyolefin resin, which can be softened or fused to develop sticky power when heated to a temperature in the vicinity of its melting point.

The peel-off sheet P is affixed to the sticky layer of the adhesive tape. On the other hand, the peel-off sheet P may be affixed or may not be affixed to a pressure-bonding surface of the thermocompression bonding sheet. In a case where a thermocompression bonding sheet free of the peel-off sheet P is used as the tape T, the tape affixing apparatus 2 may not include the peel-off sheet roller 26 as it does not need to retrieve the peel-off sheet P.

In a case where the tape T includes a thermocompression bonding sheet, at least one of the frame support table 4 and the presser roller 18 incorporates a heater and a temperature sensor, both not illustrated. When the thermocompression bonding sheet is affixed to the annular frame F, at least one of the frame support table 4 and the presser roller 18 is heated by the heater to a temperature in the vicinity of the melting point of the thermocompression bonding sheet.

Operation of the tape affixing apparatus 2 thus constructed will be described below. First, before an annular frame F is placed on the frame support table 4, the frame support table 4 is placed in a position capable of receiving an annular frame F, i.e., the position illustrated in FIGS. 1 and 2, and the presser roller 18 is put in the upper standby position. The tape T is paid out from the tape roll R. After the peel-off sheet P has been peeled off from the tape T by the driven roller 24, the tape T is positioned above the frame support table 4 while being kept taut without slackening over the frame support table 4. In a case where the tape T includes an adhesive tape, the sticky layer thereof faces downwardly toward the frame support table 4.

Then, an annular frame F unloaded from frame storage means, not illustrated, that houses a plurality of annular frames F by frame unloading means, not illustrated, is placed on the frame support table 4. The controller 10 actuates the lifting and lowering unit 6 and the presser roller positioning means to position the frame support table 4 in an affixation start position and also to position the presser roller 18 in the lower pressing position as illustrated in FIG. 3, thereby affixing the tape T to one end of the annular frame F on the frame support table 4 while applying tension to the tape T.

When the frame support table 4 is positioned in the affixation start position and the presser roller 18 is positioned in the lower pressing position, as described above, the tape T over the frame support table 4 is pressed downwardly by the presser roller 18 at one end of the annular frame F and slanted at an elevation angle α upwardly from the presser roller 18 toward the lower guide roller 30, as illustrated in FIG. 3.

Then, while the presser roller 18 is pressing the tape T downwardly against the annular frame F, the presser roller moving means rollingly moves the presser roller 18 toward the other end of the annular frame F in the Y-axis direction. The tape T can thus be affixed to the annular frame F while the tape T is being kept under uniform tension.

Figure 4:
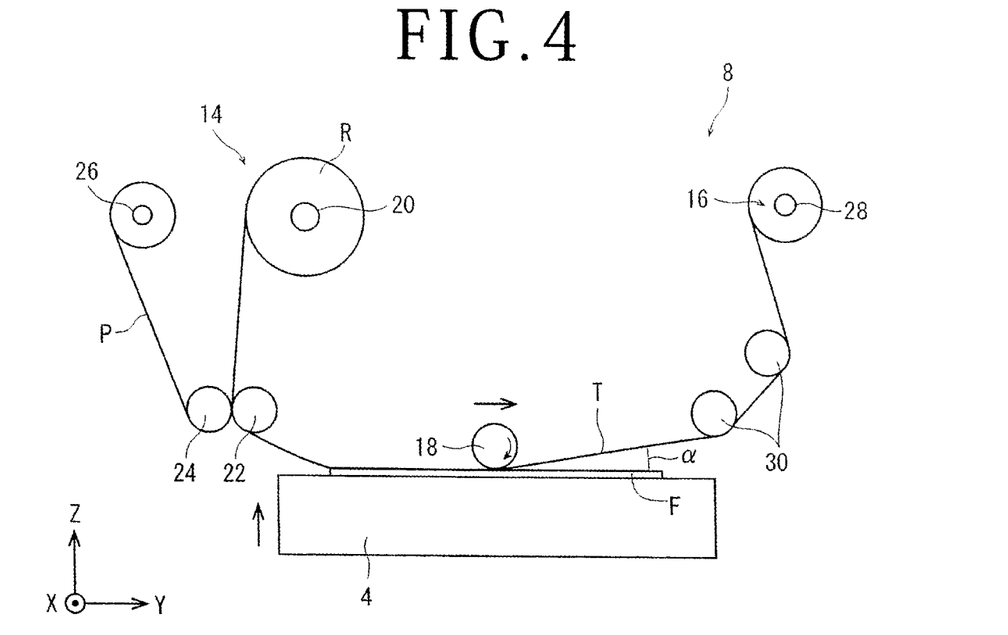
FIG. 4 is a schematic side elevational view illustrating the manner in which the presser roller has moved from the pressing position illustrated in FIG. 3.
Figure 5:
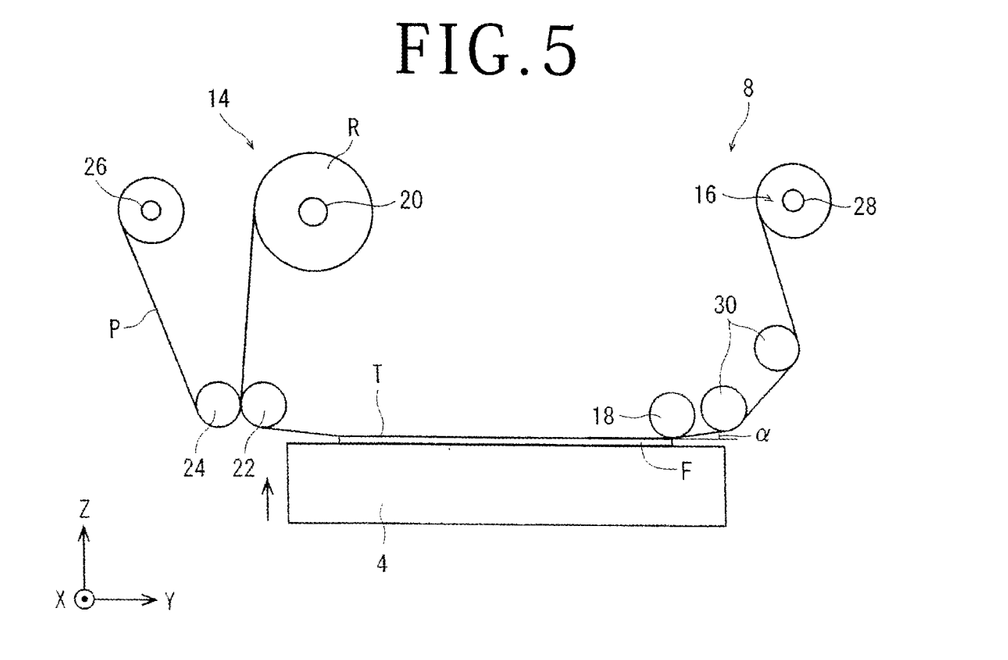
FIG. 5 is a schematic side elevational view illustrating the manner in which the presser roller has further moved from the position illustrated in FIG. 4.

When the presser roller 18 is rollingly moved in the Y-axis direction by the presser roller moving means, it is important to keep the tension applied to the tape T constant by lifting the frame support table 4 with the lifting and lowering unit 6 in synchronism with the presser roller 18 as it is moved. Specifically, as illustrated in FIGS. 4 and 5, the controller 10 controls the lifting and lowering unit 6 to lift the frame support table 4 progressively in synchronism with the presser roller 18 as it is moved, so that the elevation angle α is kept constant.

In a case where the tape T includes a thermocompression bonding sheet, the temperature of an upper surface of the frame support table 4 or the temperature of an outer circumferential surface of the presser roller 18 is adjusted to a temperature for softening or fusing the tape T, and then the presser roller 18 is rollingly moved in the Y-axis direction while keeping the tape T under constant tension, thereby thermocompression-bonding the tape T to the annular frame F. When the tape T is thermocompression-bonded to the annular frame F, the frame support table 4 is progressively lifted in synchronism with the presser roller 18 as it is moved, so that the elevation angle α is kept constant.

After the tape T has been affixed to the annular frame F, the circular cutter 44 and the presser roller 46 of the cutting mechanism 32 of the tape affixing unit 8 are lowered to press the circular cutter 44 against the tape T on the annular frame F and also to press the presser roller 46 against the annular frame F through the tape T from above. Then, the electric motor 38 is energized to rotate the arm 40 and move the circular cutter 44 and the presser roller 46 in a circle along the annular frame F. The circular cutter 44 thus moved cuts the tape T along the outer circumferential edge of the annular frame F, severing off a portion of the tape T protruding radially outwardly from the outer circumferential edge of the annular frame F, or in other words, blanking a circular tape out of the tape T and leaving the circular tape on the annular frame F.

Furthermore, since the presser roller 46 presses the annular frame F through the tape T from above, the annular frame F and the tape T are prevented from being shifted in position on the frame support table 4 while the circular cutter 44 is cutting the tape T. The tape T from which the circular tape has been blanked out, i.e., the used tape T where the circular opening To has been left by the circular tape blanked out of the tape T, is wound up by the tape take-up reel 16.

Then, the frame support table 4 is lowered by the lifting and lowering unit 6 to a position where a tape-affixed annular frame F, i.e., the annular frame F with the blanked-out circular tape affixed thereto, can be delivered from the frame support table 4. Thereafter, tape-affixed annular frame delivery means, not illustrated, delivers the tape-affixed annular frame F from the frame support table 4 to an apparatus, not illustrated, that affixes a wafer to the circular tape of the tape-affixed annular frame F while positioning the wafer in the opening Fa of the tape-affixed annular frame F. The wafer to be affixed to the tape T of the tape-affixed annular frame F may include a wafer 50 illustrated in FIG. 6A or a wafer 50' illustrated in FIG. 6B, for example.

Figure 6A:
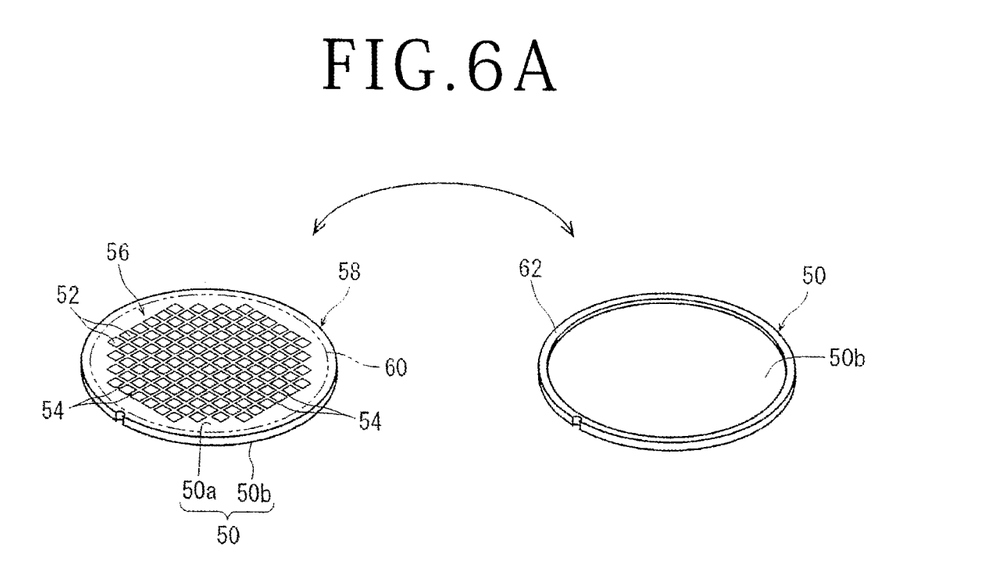
FIG. 6A is a perspective view of a wafer with a stiffener.
Figure 6B:
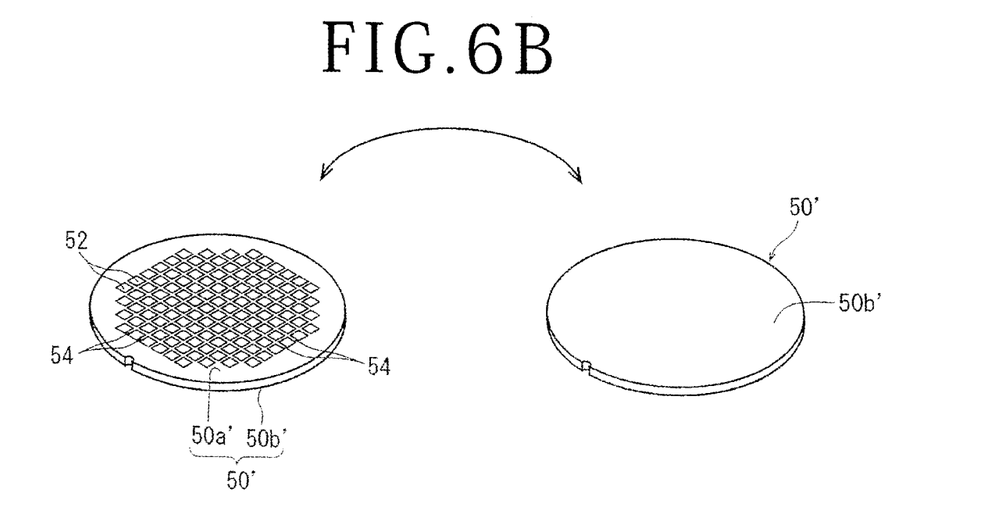
FIG. 6B is a perspective view of a wafer with no stiffener.

The wafer 50 illustrated in FIG. 6A has a face side 50*a* having a device region 56 that includes a plurality of devices 52 such as ICs or LSI circuits formed in respective areas demarcated by a grid of projected dicing lines 54 and an outer circumferential excess region 58 surrounding the device region 56. In FIG. 6A, a boundary 60 between the device region 56 and the outer circumferential excess region 58 is indicated by two-dot-and-dash lines for illustrative purposes. Actually, however, lines representing the boundary 60 do not exist on the wafer 50.

The wafer 50 has a reverse side 50b on which a ring-shaped protruding stiffener 62 is formed on and along the outer circumferential excess region 58. The ring-shaped protruding stiffener 62 is thicker than the device region 56. The wafer to be affixed to the circular tape of the tape-affixed annular frame F may be free of any ring-shaped protruding stiffener. For example, the wafer 50' illustrated in FIG. 6B has no ring-shaped protruding stiffener on a reverse side 50b' opposite a face side 50a' thereof.

Figure 7A:
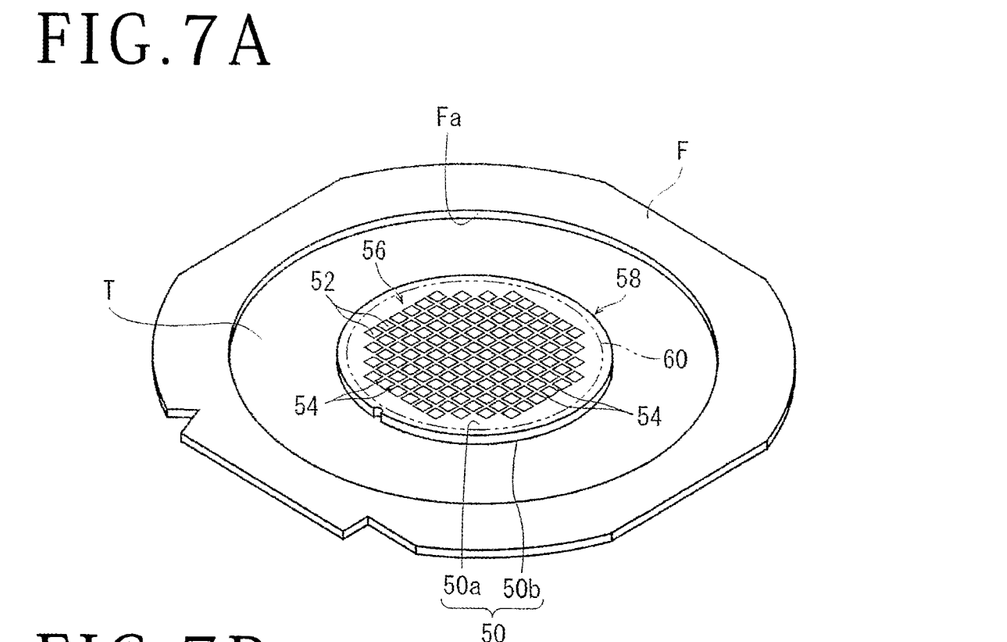
FIG. 7A is a perspective view illustrating the manner in which a reverse side of the wafer with the stiffener illustrated in FIG. 6A is affixed to a tape of a tape-affixed annular frame.
Figure 7B:
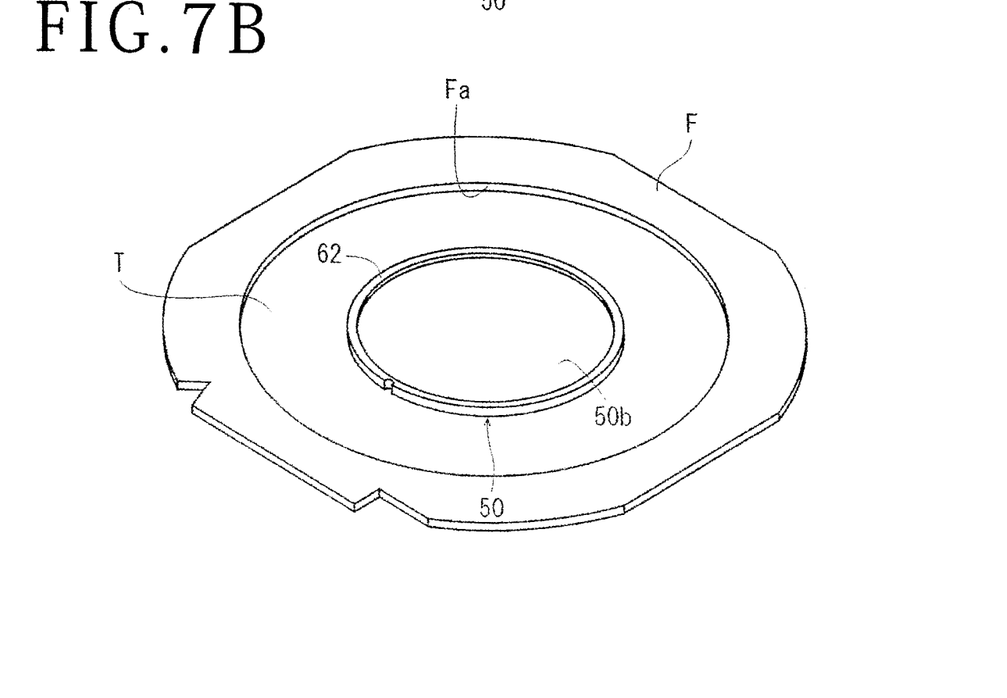
FIG. 7B is a perspective view illustrating the manner in which a face side of the wafer with the stiffener illustrated in FIG. 6A is affixed to a tape of a tape-affixed annular frame.
Figure 8A:
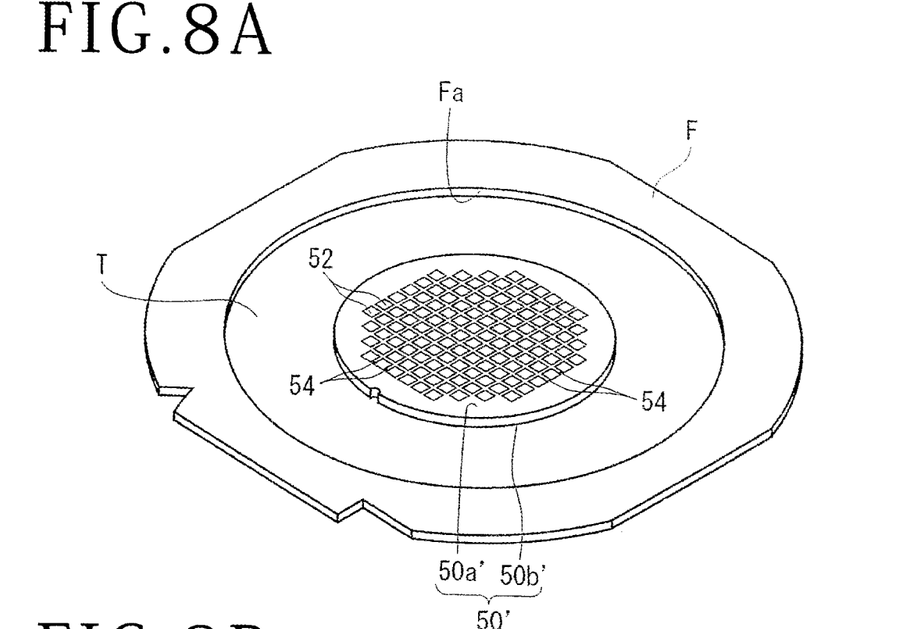
FIG. 8A is a perspective view illustrating the manner in which a reverse side of the wafer with no stiffener illustrated in FIG. 6B is affixed to a tape of a tape-affixed annular frame.
Figure 8B:
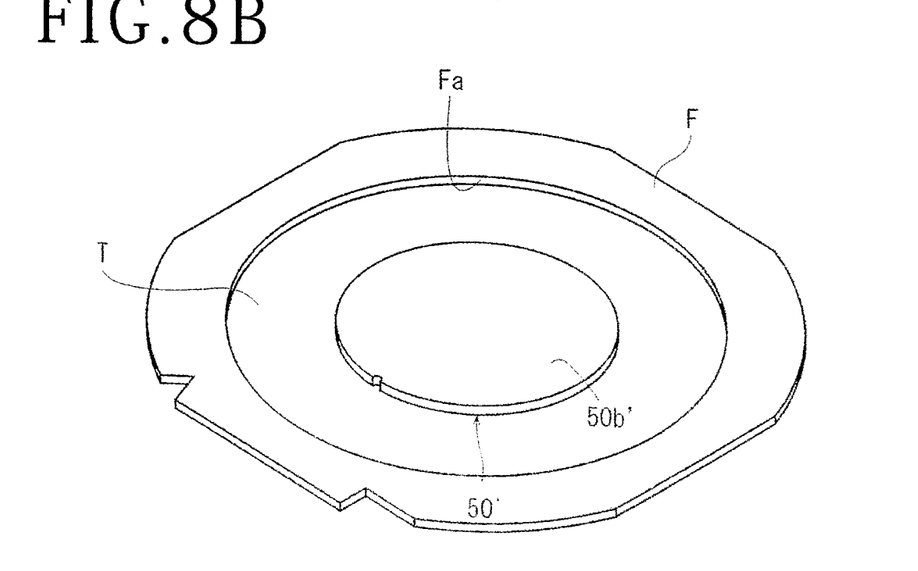
FIG. 8B is a perspective view illustrating the manner in which a face side of the wafer with no stiffener illustrated in FIG. 6B is affixed to a tape of a tape-affixed annular frame.

For affixing the wafer 50 to the circular tape, also referred to as a "tape T," of the tape-affixed annular frame F, the reverse side 50b of the wafer 50 may be affixed to the tape T as illustrated in FIG. 7A or the face side 50a of the wafer 50 may be affixed to the tape T as illustrated in FIG. 7B. For affixing the wafer 50' free of a ring-shaped stiffener to the tape T, the reverse side 50b' of the wafer 50' may be affixed to the tape T as illustrated in FIG. 8A or the face side 50a' of the wafer 50' may be affixed to the tape T as illustrated in FIG. 8B.

According to the present embodiment, as described above, inasmuch as the tape T is affixed to the annular frame F while the tape T is being kept under uniform tension, the tape T is prevented from developing wrinkles when the wafer 50 or 50' is affixed to the tape T of the tape-affixed annular frame F.

After the wafer 50 with the ring-shaped stiffener 62 has been affixed to the tape T, an annular groove is formed in the wafer 50 along the base of the ring-shaped stiffener 62 by way of laser ablation on a laser processing apparatus or by way of cutting on a dicing apparatus. Then, the ring-shaped stiffener 62 is peeled off from the tape T. At this time, the tape T is prevented from developing wrinkles because the tape T has been affixed to the annular frame F while being kept under uniform tension according to the present embodiment.

More specifically, the tape affixing apparatus 2 is able to affix the tape T to the annular frame F while keeping the tape T under uniform tension large enough to prevent the tape T from developing wrinkles when the ring-shaped stiffener 62 is removed from the wafer 50 affixed to the tape T of the tape-affixed annular frame F.

As described above, since the tape affixing apparatus 2 according to the present embodiment prevents the tape T from developing wrinkles when the ring-shaped stiffener 62 is removed from the wafer 50 affixed to the tape T of the tape-affixed annular frame F, no trouble is caused at the time of dividing the wafer 50 into individual device chips.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A tape affixing apparatus for affixing a tape to an annular frame having an opening defined centrally therein for accommodating a wafer therein, comprising:

a frame support table for supporting the annular frame thereon;
   a lifting and lowering unit for lifting and lowering the frame support table;
   a tape affixing unit disposed in facing relation to the frame support table; and
   a controller,
      a tape uncoiler for paying out the tape;
      a tape take-up reel for winding up the tape that has been used, and
      a presser roller disposed between the tape uncoiler and the tape take-up reel and movable from a first end to an opposing, second end of the annular frame supported on the frame support table while pressing the tape paid out from the tape uncoiler to affix the tape to the annular frame, and
      the controller positions the presser roller in a pressing position, affixes the tape to the first end of the annular frame while applying tension to the tape, moves the presser roller toward the second end of the annular frame, and keeps the tension applied to the tape constant by lifting the frame support table simultaneously with moving the presser roller toward the second end of the annular frame.

2. The tape affixing apparatus according to claim 1, wherein, when the presser roller is positioned in the pressing position, the tape is slanted at an elevation angle upwardly from the presser roller toward the tape take-up reel, and the frame support table is lifted in synchronism with the presser roller as it is moved, so that the elevation angle is kept constant.

3. The tape affixing apparatus according to claim 1, wherein the tape affixing unit includes a cutter rotatable in contact with the annular frame for cutting the tape.

4. The tape affixing apparatus according to claim 1, wherein the tape uncoiler includes a delivery roller and the tape includes a peel-off sheet,
   wherein the tape affixing unit further includes,
      a driven roller adjacent to the delivery roller, the driven roller configured to rotate the delivery roller, wherein the tape passes between the delivery roller and the driven roller; and
      a peel-off sheet roller for winding up the peel-off tape separated from the tape.

5. The tape affixing apparatus according to claim 1, wherein at least one of the frame support table and the presser roller incorporates a heater and a temperature sensor.

6. The tape affixing apparatus according to claim 3, further comprising a guide member and a movable member movably attached to the guide member, wherein the cutter is attached to the movable member and is movable toward and away from the frame support table.

7. The tape affixing apparatus according to claim 3, wherein the cutter is attached to a first end of an arm and a presser roller is attached to a second, opposing end of the arm, wherein the arm is configured to rotate.

8. The tape affixing apparatus according to claim 1, wherein the lifting and lowering unit includes an electric motor.

* * * * *

UNITED STATES PATENT AND TRADEMARK OFFICE
CERTIFICATE OF CORRECTION

| | | |
|---|---|---|
| PATENT NO. | : 12,208,984 B2 | Page 1 of 1 |
| APPLICATION NO. | : 17/931693 | |
| DATED | : January 28, 2025 | |
| INVENTOR(S) | : Uchiho et al. | |

It is certified that error appears in the above-identified patent and that said Letters Patent is hereby corrected as shown below:

In the Specification

Column 1, Line 46    Please delete "Japanese Patent Application No. 2020-123301" and insert --Japanese Patent Application No. 2020-123201-- therefor.

Column 1, Line 53    Please delete "Japanese Patent Application No. 2020-123301" and insert --Japanese Patent Application No. 2020-123201-- therefor.

Signed and Sealed this
Twenty-ninth Day of April, 2025

Coke Morgan Stewart
*Acting Director of the United States Patent and Trademark Office*